(12) United States Patent
Fujino et al.

(10) Patent No.: US 10,514,560 B2
(45) Date of Patent: Dec. 24, 2019

(54) LIGHT-MODULATING FILM AND METHOD FOR PRODUCING SAME, AND LIGHT-MODULATING ELEMENT

(71) Applicant: NITTO DENKO CORPORATION, Ibaraki-shi, Osaka (JP)

(72) Inventors: Nozomi Fujino, Ibaraki (JP); Masayoshi Katagiri, Ibaraki (JP); Tomotake Nashiki, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 128 days.

(21) Appl. No.: 15/576,053

(22) PCT Filed: May 18, 2016

(86) PCT No.: PCT/JP2016/064731
§ 371 (c)(1),
(2) Date: Nov. 21, 2017

(87) PCT Pub. No.: WO2016/186131
PCT Pub. Date: Nov. 24, 2016

(65) Prior Publication Data
US 2018/0164611 A1    Jun. 14, 2018

(30) Foreign Application Priority Data

May 21, 2015  (JP) ................. 2015-103615
May 13, 2016  (JP) ................. 2016-097282

(51) Int. Cl.
*G02F 1/00* (2006.01)
*G02F 1/1516* (2019.01)
*G02F 1/15* (2019.01)

(52) U.S. Cl.
CPC .............. *G02F 1/0018* (2013.01); *G02F 1/15* (2013.01); *G02F 1/15165* (2019.01)

(58) Field of Classification Search
CPC ...... G02F 1/0018; G02F 1/15165; G02F 1/15; G02F 1/19; G02B 5/00
See application file for complete search history.

(56) References Cited

U.S. PATENT DOCUMENTS

2014/0247474 A1   9/2014   Yamada et al.
2015/0168801 A1   6/2015   Yamada et al.

FOREIGN PATENT DOCUMENTS

EP    2559778    *   2/2013   ............ C22C 19/00
EP    2559778 A1      2/2013

(Continued)

OTHER PUBLICATIONS

International Search Report dated Aug. 16, 2016 corresponding to International Application No. PCT/JP2016/064731.

(Continued)

*Primary Examiner* — Joseph P Martinez
(74) *Attorney, Agent, or Firm* — Hauptman Ham, LLP

(57) ABSTRACT

The light modulation film (1) is a hydrogen-activation-type light modulation film that includes an inorganic oxide layer (20), a light modulation layer (30) and a catalyst layer (40), in this order on a polymer film substrate (10). The light modulation layer (30) is a layer for reversibly changing states between a transparent state due to hydrogenation and a reflective state due to dehydrogenation. The catalyst layer (40) promotes hydrogenation and dehydrogenation in the light modulation layer. The inorganic oxide layer (20) contains an oxide of an element different from a metal element that constitutes the light modulation layer (30).

11 Claims, 3 Drawing Sheets

(56) References Cited

FOREIGN PATENT DOCUMENTS

| JP | 4628741 | * | 2/2011 | ............... G02F 1/15 |
| JP | 4628741 B2 | | 2/2011 | |
| JP | 2013-083911 A | | 5/2013 | |
| JP | 2014-26262 A | | 2/2014 | |
| JP | 2014-218726 A | | 11/2014 | |
| WO | 2011/046050 A1 | | 4/2011 | |

OTHER PUBLICATIONS

Translation of International Preliminary Report on Patentability with Written Opinion of the International Searching Authority dated Nov. 30, 2017, corresponding to International Application No. PCT/JP2016/064731.

Shanhu Bao et al, "Gasochromic Properties of Mg-Ni Switchable Mirror Thin Films on Flexible Sheets", Japanese Journal of Applied Physics, 2008, pp. 7993-7997, vol. 47, No. 10, cited in NPL No. 3.

Kazuki Tajima et al., "Analysis of Degradation of Flexible All-Solid-State Switchable Mirror Based on Mg-Ni Thin Film", Japanese Journal of Applied Physics, 2009, p. 102402, vol. 48, No. 10, cited in NPL No. 3.

The extended European search report for corresponding European application No. 16796524.3 dated Jan. 11, 2019.

\* cited by examiner

LIGHT-MODULATING FILM AND METHOD FOR PRODUCING SAME, AND LIGHT-MODULATING ELEMENT

CROSS REFERENCE TO RELATED APPLICATION

This application claims the priority of International Application No. PCT/JP2016/064731, filed on May 18, 2016, which claims priority to Japanese Application Nos. 2015-103615, filed on May 21, 2015 and 2016-097282, filed on May 13, 2016. The entire disclosures of each of the above applications are incorporated herein by reference.

TECHNICAL FIELD

The present invention relates to a light modulation film which is used for a hydrogen-activation-type light modulation element capable of switching between a transparent state and a reflective state by hydrogenation and dehydrogenation, and a method for manufacturing the light modulation film. The present invention also relates to a light modulation element including the light modulation film.

BACKGROUND ART

Light modulation elements are used for window panes of buildings and vehicles, interior materials, and the like. Particularly in recent years, demand and expectation for light modulation elements have been increased from the viewpoints of reducing a cooling and heating load, reducing a lighting load, improving comfort, and so on.

As the light modulation element, the following systems have been developed: an electric field drive system in which a liquid crystal material or an electrochromic material is used, and the light transmittance is controlled by application of an electric field; a thermochromic system using a thermochromic material, of which the light transmittance is changed with a temperature; a gas chromic system in which the light transmittance is controlled by controlling an atmospheric gas.

Examples of the method for controlling the light transmittance include a method of switching between transmission and scattering of light by a light modulation material, a method of switching between transmission and absorption of light, and a method of switching between transmission and reflection of light. Among them, a hydrogen-activation-type light modulation element that switches between transmission and reflection of light by hydrogenation and dehydrogenation of a light modulation material has an advantage that light from outside can be reflected to prevent inflow of heat, and therefore excellent heat shielding property is exhibited, so that a high energy saving effect is obtained. In addition, since it is able to switch between hydrogenation and dehydrogenation by a gas chromic system, it is possible to increase the area and reduce the cost.

As hydrogen-activation-type light modulation materials capable of reversibly switching between a transparent state and a reflective state by hydrogenation and dehydrogenation, rare earth metals such as yttrium, lanthanum and gadolinium, alloys of a rare earth metal and magnesium, alloys of an alkaline earth metals such as calcium, strontium or barium and magnesium, and alloys of a transition metal such as nickel, manganese, cobalt or iron and magnesium are known. Particularly, when a magnesium alloy is used as the light modulation material, a light modulation element having a high light transmittance in a transparent state is obtained because magnesium hydride has a visible light transmittance.

In the hydrogen-activation-type light modulation element, a catalyst layer is provided in proximity to a light modulation layer composed of a light modulation material. The catalyst layer has a function of promoting hydrogenation and dehydrogenation of the light modulation layer. As the catalyst layer, palladium, platinum, a palladium alloy, a platinum alloy or the like is used. As such a hydrogen-activation-type light modulation element, one including a light modulation layer and a catalyst layer on a glass substrate has been heretofore studied (e.g., Patent Document 1). For the hydrogen-activation-type light modulation material, it is known that when switching between a transparent state by hydrogenation and a reflection state by dehydrogenation is repeated, switching characteristics may be deteriorated because magnesium in a magnesium alloy in a light modulation layer passes through a catalyst layer, and is deposited on the surface, and oxidized. It has been suggested that a buffer layer such as a metal thin-film or a hydrogenated metal thin-film is provided between a light modulation layer and a catalyst layer for suppressing migration of magnesium to the catalyst layer (e.g., Patent Document 2).

PRIOR ART DOCUMENTS

Patent Documents

Patent Document 1: JPA 2013-83911
Patent Document 2: JPA 2014-26262

SUMMARY OF THE INVENTION

Problems to be Solved by the Invention

It may be useful to use a film substrate in place of a glass substrate for attaining mass production and cost reduction of a hydrogen-activation-type light modulation element. When a film substrate is used, and a continuous deposition method such as roll-to-roll sputtering is employed, a light modulation film including a light modulation layer and a catalyst layer with a uniform thickness and uniform characteristics can be provided with a large length, and therefore it is easy to increase an area. In addition, when a film substrate is used, the film is easily bonded to general glass or the like, and applicable to a curved surface, resulting in excellent versatility.

Patent Document 2 suggests that the substrate may be a flexible film, but this document does not show a specific example in which a light modulation layer is formed on a film substrate. The present inventors attempted to prepare a light modulation film including a hydrogen-activation-type light modulation layer on a film substrate, and resultantly found that the light modulation film had lower light modulation performance as compared to a case where a light modulation layer was formed on a glass substrate under the same conditions. In view of such a problem, an object of the present invention is to provide a hydrogen-activation-type light modulation film including a light modulation layer on a film substrate and having light modulation performance comparable to light modulation performance obtained when a glass substrate is used.

Means for Solving the Problems

The present inventors have conducted studies to find that when a light modulation layer is deposited on a film substrate, an oxide film having a large thickness (e.g., 15 nm or more) is formed in the vicinity of the interface of the deposit layer with the film substrate, and this oxide film causes deterioration of light modulation performance. In view of such findings, the present inventors have further conducted studies, and resultantly found that when an inorganic oxide layer including a material different from that of the light modulation layer is provided on the film substrate, oxidation of a light modulation layer is suppressed.

The light modulation film of the present invention includes an inorganic oxide layer, a light modulation layer and a catalyst layer in this order on a polymer film substrate. The state of the light modulation layer is reversibly changed between a transparent state by hydrogenation and a reflective state by dehydrogenation. The catalyst layer promotes hydrogenation and dehydrogenation in the light modulation layer. The inorganic oxide layer contains an oxide of an element different from the metal element that constitutes the light modulation layer.

For the light modulation layer, a metal thin-film of a rare earth metal, an alloy of a rare earth metal and magnesium, an alloy of an alkaline earth metal and magnesium, an alloy of a transition metal and magnesium, or the like is preferably used. The light modulation layer may contain the above-mentioned metal in the form of a hydride. The thickness of the light modulation layer is preferably 10 to 500 nm.

For the inorganic oxide layer, an oxide thin-film containing an oxide of Si, Ge, Sn, Pb, Al, Ga, In, Tl, As, Sb, Bi, Se, Te, Mg, Ca, Sr, Ba, Sc, Y, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd or the like is preferably used. The thickness of the inorganic oxide layer is preferably 1 to 200 nm. In addition, the thickness of the inorganic oxide layer is preferably smaller than the thickness of the light modulation layer.

The light modulation film of the present invention is obtained by, for example, depositing an inorganic oxide layer, a light modulation layer and a catalyst layer on a film substrate by roll-to-roll sputtering.

Further, the present invention relates to a light modulation element including the light modulation film. The light modulation film of the present invention is suitable for a gas chromic-type light modulation element because the light modulation layer can be hydrogenated and dehydrogenated by a gas chromic system. One embodiment of a gas chromic-type light modulation element includes a plurality of transparent members (e.g., multi-layered glass), where gaps between the transparent members form a gas-filling chamber. A light modulation element is formed by disposing a light modulation film in the gas-filling chamber. Preferably, the gas chromic-type light modulation element further includes an atmosphere control device. The atmosphere control device is configured such that hydrogen can be supplied to and discharged from the inside of the gas-filling chamber.

Effects of the Invention

In the light modulation film of the present invention, an inorganic oxide layer is provided between the polymer film substrate and the light modulation layer, and therefore oxidation of the light modulation layer by moisture, oxygen or the like from the polymer film substrate is suppressed. Thus, in the light modulation film of the present invention, high light modulation performance comparable to that in the case of using a glass substrate can be exhibited by hydrogenation and dehydrogenation.

MODE FOR CARRYING OUT THE INVENTION

[Configuration of Light Modulation Film]

Figure 1:
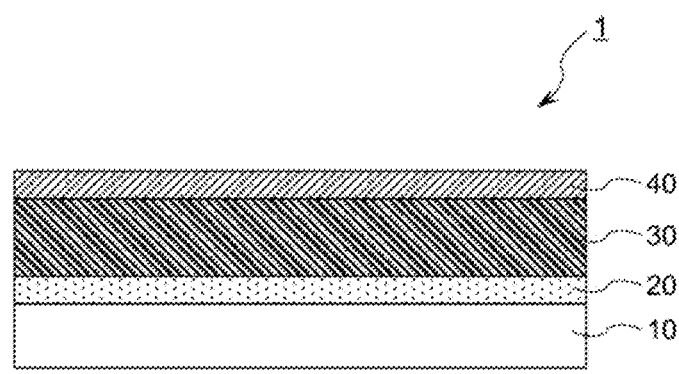
FIG. 1 is a schematic sectional view showing one embodiment of a light modulation film.

FIG. 1 is a schematic sectional view showing one embodiment of a light modulation film of the present invention. The light modulation film 1 of the present invention includes a light modulation layer 30, an inorganic oxide layer 20 and a catalyst layer 40 on a polymer film substrate 10.

<Film Substrate>

The polymer film substrate 10 may be transparent or opaque. A transparent plastic material is preferably used as a material of the polymer film substrate for making the light modulation film light-transmissive in a state in which the light modulation layer is hydrogenated. Examples of the plastic material include polyesters such as polyethylene terephthalate, polyolefins, cyclic polyolefins such as norbornene-based cyclic polyolefins, polycarbonate, polyether sulfone, and polyarylates.

The thickness of the polymer film substrate 10 is not particularly limited. The thickness of the polymer film is generally about 2 to 500 μm, and is preferably about 20 to 300 μm. A surface of the polymer film substrate 10 may be provided with an easily adhesive layer, an antistatic layer, a hard coat layer and the like. In addition, a surface of the polymer film substrate 10 may be subjected to an appropriate adhesion treatment such as a corona discharge treatment, an ultraviolet irradiation treatment, a plasma treatment, sputtering etching treatment or the like for improving adhesion with the inorganic oxide layer 20.

The arithmetic mean roughness Ra of the polymer film substrate 10 on the inorganic oxide layer 20-formed surface side is preferably 5 nm or less, more preferably 3 nm or less, further preferably 1 nm or less. By reducing the surface roughness of the substrate, the coverage of the inorganic oxide layer tends to be improved, leading to enhancement of gas barrier property in formation of the light modulation layer on the inorganic oxide layer. The arithmetic mean roughness Ra can be determined from a 1 μm-square AFM observation image obtained using a scanning probe microscope (AFM).

<Inorganic Oxide Layer>

On the polymer film substrate 10, an inorganic oxide layer 20 is formed. The inorganic oxide layer 20 serves as an underlayer during deposition of the light modulation layer 30, and acts to block moisture, oxygen gas and the like generated from the polymer film substrate 10, so that oxidation of the light modulation layer is suppressed.

The material of the inorganic oxide layer 20 is not particularly limited as long as it is an oxide thin-film having a material (metal element composition) different from that of the light modulation layer 30 formed on the inorganic oxide layer 20. For enhancing barrier property against a gas from the polymer film substrate, for example, an oxide of a metal element or a semimetal element such as Si, Ge, Sn, Pb, Al, Ga, In, Tl, As, Sb, Bi, Se, Te, Mg, Ca, Sr, Ba, Sc, Y, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn or Cd is preferably used as the inorganic oxide that constitutes the inorganic oxide layer 20. The inorganic oxide layer may contain a mixed oxide of plurality of (semi)metals. Among them, an oxide of Si, Nb, Ti or the like is preferably used because it absorbs little light, and is excellent in gas barrier property against oxygen, water vapor and the like.

Preferably, the inorganic oxide layer 20 has a metal element composition different from that of the later-described light modulation layer 30. The inorganic oxide layer 20 having a metal element composition different from that of the light modulation layer 30 means that the light modulation layer does not contain 5 atom % or more of one or more of metal elements or semimetal elements contained in the inorganic oxide layer in an amount of 5 atom % or more, or that the inorganic oxide layer does not contain 3 atom % or more of one or more of metal elements or semimetal elements contained in the light modulation layer in an amount of 5 atom % or more. More preferably, the light modulation layer does not contain 5 atom % or more of any of metal elements or semimetal elements contained in the inorganic oxide layer in an amount of 5 atom % or more, and the inorganic oxide layer does not contain 5 atom % or more of any of metal elements contained in the light modulation layer in an amount of 5 atom % or more. When a material having a metal element composition different from that of the light modulation layer 30 is employed as the inorganic oxide layer 20, deterioration of light modulation performance can be suppressed.

It is preferable that the inorganic oxide layer 20 has high gas barrier property against oxygen, moisture and the like, and has a low permeability to a gas that may be generated from a polymer film substrate, such as moisture or oxygen. For example, the water permeability under an environment at 40° C. and 90% RH is preferably 10 $g/m^2$ day or less, more preferably 5 $g/m^2$ day or less, further preferably 1 $g/m^2$ day or less. When the water permeability is in the above-mentioned range, oxidation of the light modulation layer due to outgas from the polymer film substrate during deposition of the light modulation layer is suppressed, so that a light modulation film having high light modulation performance is obtained. The lower limit of the water permeability is not particularly limited. Generally, the water permeability is 0.00001 $g/m^2$ day or more.

The water permeability (moisture permeability) is measured in accordance with JIS K 7129: 2008 Annex B. The inorganic oxide layer is a thin-film, and it is difficult to determine the moisture permeability of the inorganic oxide layer alone. Thus, the moisture permeability may be measured with the inorganic oxide layer formed on the polymer film substrate. Since many polymer films have a moisture permeability sufficiently larger than the moisture permeability of the inorganic oxide layer, the moisture permeability of a stack with an inorganic oxide layer provided on a polymer film can be considered to be equal to the moisture permeability of the inorganic oxide layer alone.

When a film having high gas barrier property (low water permeability), such as a cycloolefin polymer film, is used as the polymer film substrate, the difference between the moisture permeability of a polymer film substrate alone and the moisture permeability of a stack with an inorganic oxide layer provided on the polymer film is not sufficient, and thus it may be difficult to accurately measure the moisture permeability of the inorganic oxide layer from the moisture permeability of the stack. In this case, the moisture permeability of the stack may be measured with an inorganic oxide layer formed on a 50 μm-thick PET film substrate under the same conditions as in deposition of the inorganic oxide layer on the polymer film substrate. The 50 μm-thick PET film substrate has a moisture permeability sufficiently higher than 10 $g/m^2$ day under an environment at 40° C. and 90% RH. Thus, when the moisture permeability of the inorganic oxide layer is 10 $g/m^2$ day or less, the moisture permeability of the stack with the inorganic oxide layer provided on the PET film substrate is substantially equal to the moisture permeability of the inorganic oxide layer alone. Therefore, by measuring the moisture permeability of the stack with the inorganic oxide layer provided on the 50 μm-thick PET film substrate, a moisture permeability of the inorganic oxide layer alone can be determined.

The thickness of the inorganic oxide layer 20 is not particularly limited as long as barrier property against oxygen, moisture and the like can be imparted to suppress outgas from a polymer film. For forming a continuous film, the thickness of the inorganic oxide layer is preferably 1 nm or more. On the other hand, when the thickness is excessively large, productivity tends to be deteriorated, and the light transmittance tends to be reduced due to absorption of light by the inorganic oxide layer. Therefore the thickness of the inorganic oxide layer is preferably 200 nm or less. The thickness of the inorganic oxide layer is more preferably 2 to 60 nm, further preferably 5 to 50 nm. When the inorganic oxide layer is formed by a sputtering method, the deposition rate tends to be lower than that in formation of the metal layer. In addition, the inorganic oxide layer causes absorption of light as described above, and therefore the thickness is preferably as small as possible within a range which ensures that outgas from the polymer film substrate can be suppressed. The thickness of the inorganic oxide layer 20 is preferably smaller than the thickness of the light modulation layer 30 formed on the inorganic oxide layer 20, and more preferably not more than 0.8 times of the thickness of the light modulation layer.

The inorganic oxide layer 20 may be a stack of a plurality of oxide thin-films. For example, when a plurality of oxide thin-films having different refractive indices are stacked, and the optical thickness of each layer is adjusted, reflection of light between the light modulation layer 30 and the polymer film substrate 10 can be reduced to increase the light transmittance in the transparent state. When the inorganic oxide layer includes a plurality of layers, it is preferable that the total thickness is within the above-mentioned range.

<Light Modulation Layer>

The material of the light modulation layer 30 is not particularly limited as long as it contains a chromic material, the state of which is reversibly changed between a transparent state by hydrogenation and a reflective state by dehydrogenation. Specific examples of the material that constitutes the light modulation layer include rare earth metals such as Y, La, Gd and Sm, alloys of a rare earth metal and magnesium, alloys of an alkaline earth metal such as Ca, Sr or Ba and magnesium, and alloys of a transition metal such as Ni, Mn, Co or Fe and magnesium. The light modulation layer 30 may contain an element other than the above-mentioned alloy as a minor component.

The metal or alloy that constitutes the light modulation layer 30 contains a metal element which is transformed into a transparent state by hydrogenation, and is transformed back into a reflective state by releasing hydrogen. For example, magnesium is transformed into transparent $MgH_2$ when hydrogenated, and is transformed back into Mg with a metallic reflection when dehydrogenated.

Although the thickness of the light modulation layer 30 is not particularly limited, it is preferably 10 nm to 500 nm, more preferably 15 nm to 200 nm, further preferably 20 nm to 100 nm for securing both the light transmittance in the transparent state and the light shielding ratio (reflectance) in the reflective state. When the thickness of the light modulation layer is excessively small, the light reflectance in the reflective state tends to decrease, and when the thickness of the light modulation layer is excessively large, the light transmittance in the transparent state tends to decrease.

When a light modulation layer is formed on a polymer film, an oxidizing gas such as moisture or oxygen is released from the polymer film during deposition and in a use environment, and thus the light modulation layer may be oxidized. Even when a polymer film substrate excellent in gas barrier property is used, moisture, oxygen and the like contained in the polymer film substrate itself may be released during sputtering deposition of the light modulation layer, resulting in oxidation of the light modulation layer. Oxidation of the light modulation layer causes deterioration of light modulation performance (a difference between transmittances in hydrogenation and in dehydrogenation). In particular, magnesium has a high bonding strength with oxygen, and once magnesium is oxidized, it is no longer hydrogenated even when hydrogen is introduced, and therefore the light modulation performance of a light modulation layer containing magnesium tends to considerably deteriorated by oxidation. On the other hand, in the present invention, the inorganic oxide layer 20 is formed between the polymer film substrate 10 and the light modulation layer 30, and therefore permeation of moisture, oxygen and the like from the substrate 10 into the light modulation layer 30 is suppressed. Thus, oxidation of the light modulation layer is suppressed, so that a light modulation element excellent in light modulation performance and durability is obtained.

The light modulation layer 30 formed on the inorganic oxide layer 20 may have an oxidized region (region having an oxygen concentration of 50 atom % or more) in a thickness of 10 nm or less in the vicinity of the interface with the inorganic oxide layer 20. The oxygen concentration can be measured by X-ray photoelectron spectroscopy (XPS). Even when an oxidized region is formed in the light modulation layer 30, favorable light modulation performance can be maintained because the ratio of the oxidized region to the entire thickness of the light modulation layer is small as long as the thickness of the oxidized region is 10 nm or less. The thickness of the oxidized region is preferably 8 nm or less, more preferably 5 nm or less.

<Catalyst Layer>

The catalyst layer 40 has a function of promoting hydrogenation and dehydrogenation in the light modulation layer 30. The catalyst layer 40 increases the switching speed in switching from the reflective state to the transparent state (hydrogenation of the light modulation layer) and switching from the transparent state to the reflective state (dehydrogenation of the light modulation layer).

The material of the catalyst layer 40 is not particularly limited as long as the catalyst layer 40 has a function of promoting hydrogenation and dehydrogenation of the light modulation layer 30, and it is preferable that catalyst layer 40 has at least one metal selected from, for example, palladium, platinum, a palladium alloy and a platinum alloy. In particular, palladium is preferably used because it has high hydrogen permeability.

The thickness of the catalyst layer 40 can be appropriately set according to the reactivity of the light modulation layer 30, the catalytic ability of the catalyst layer 40, and the like. Although the thickness of the catalyst layer 40 is not particularly limited, it is preferably 1 to 30 nm, more preferably 2 to 20 nm. When the thickness of the catalyst layer is excessively small, the catalytic function for hydrogenation and dehydrogenation is not sufficiently exhibited in some cases, and when the thickness of the catalyst layer is excessively large, the light transmittance tends to decrease.

<Buffer Layer and Surface Layer>

Figure 2:
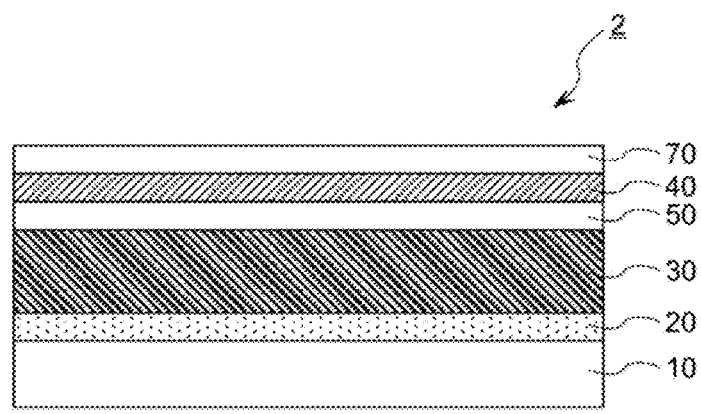
FIG. 2 is a schematic sectional view showing one embodiment of a light modulation film.

The light modulation film of the present invention may include a layer other than the light modulation layer 30, the inorganic oxide layer 20, and the catalyst layer 40 on the polymer film substrate 10. For example, as in the light modulation film 2 shown in FIG. 2, a buffer layer 50 may be provided between the light modulation layer 30 and the catalyst layer 40, or a surface layer 70 may be provided on the catalyst layer 40.

The buffer layer 50 is preferably permeable to hydrogen and capable of suppressing oxidation of the light modulation layer and migration of a metal from the light modulation layer to the catalyst layer. For example, when a metal thin-film including Ti, Nb, V, an alloy of these metals, or the like is inserted as the buffer layer 50 between the light modulation layer 30 and the catalyst layer 40, the switching speed from the transparent state to the reflective state in dehydrogenation tends to increase while migration of magnesium etc. from the light modulation layer and the catalyst layer is suppressed.

When a metal thin-film including W, Ta, Hf, an alloy of these metals, or the like is inserted as the buffer layer 50, passage of oxygen to the light modulation layer 30 from the catalyst layer 40 side can be suppressed to inhibit degradation of the light modulation layer by oxidation. When a metal thin-film including a metallic material similar to that in the light modulation layer, for example Sc, an Mg—Sc alloy or a hydride thereof is inserted as the buffer layer 50, the layer functions as a sacrificial layer which reacts with oxygen passing through the catalyst layer 40, so that oxidation of the light modulation layer 30 can be suppressed. Preferably, the buffer layer acting as such a sacrificial layer is reversibly bonded with oxygen, and hydrogenated in hydrogenation of the light modulation layer 30 (transparent state), so that the light transmittance increases. Thus, when a magnesium alloy is used for the buffer layer, the content of magnesium based on the total amount of metallic elements is preferably less than 50 atom %.

The thickness of the buffer layer 50 can be appropriately set according to its purpose and so on, and is not particularly limited. The thickness is, for example, 1 to 200 nm, and preferably 2 to 30 nm. The buffer layer may include only one layer or a plurality of layers. For example, the buffer layer 50 may be a stack of a layer having a function of suppressing migration of a metal such as magnesium from the light modulation layer 30 and a layer suppressing passage of oxygen from the catalyst layer 40 side to the light modulation layer 30.

When the surface layer 70 is provided on the catalyst layer 40, the surface layer 70 may be permeable to hydrogen. Preferably, the surface layer 70 has a function of blocking passage of water and oxygen to prevent oxidation of the light modulation layer 30. In addition, by adjusting the optical thickness of the surface layer 70, light reflection at a surface of the light modulation film can be reduced to increase the light transmittance in the transparent state.

As a material of the surface layer 70, a (semi)metal oxide shown as an example as the material of the inorganic oxide layer, a metal shown as an example as the material of the buffer layer, or the like can be used. As a material of the surface layer 70, an organic material such as a polymer, an organic-inorganic hybrid material, or the like may also be used. When a material having water repellency such as a fluorine-based resin is used for the surface layer 70, the function of suppressing oxidation of the light modulation layer 30 by water or oxygen can be further enhanced to improve the durability of the light modulation element.

The thickness of the surface layer 70 can be appropriately set according to its purpose and so on, and is not particularly limited. The thickness is, for example, about 1 nm to 50 μm. The surface layer may include only one layer, or a plurality of layers. For example, when a plurality of thin-films having different refractive indices are stacked, and the optical thickness of each layer is adjusted, antireflection property can be improved to increase the light transmittance in the transparent state. In addition, durability can also be improved by combining an organic layer and an inorganic layer.

[Method for Preparing Light Modulation Film]

A light modulation film can be prepared by depositing the inorganic oxide layer 20, the light modulation layer 30, and the catalyst layer 40 sequentially on the polymer film substrate 10. When the buffer layer is deposited after deposition of the light modulation layer 30 and before deposition of the catalyst layer 40, a light modulation film including the buffer layer 50 is obtained.

The method for depositing these layers is not particularly limited, and for example, deposition methods such as a sputtering method, a vacuum vapor deposition method, an electron beam vapor deposition method, a chemical vapor deposition (CVD) method, a chemical bath deposition (CBD) method and a plating method can be employed. Among them, a sputtering method is preferable because a uniform and dense film can be deposited. Particularly, when a roll-to-roll sputtering apparatus is used, and deposition is performed while a long polymer film substrate is continuously moved in the longitudinal direction, productivity of the light modulation film can be improved. In roll-to-roll sputtering, a plurality of thin-films can be deposited in one film conveyance when a plurality of cathodes are arranged along the circumferential direction of one deposition roll, or a sputtering apparatus including a plurality of deposition rolls is employed. Therefore, productivity may be further improved.

It is preferable that after the sputtering apparatus is loaded with a roll-shaped film substrate and before sputtering deposition is started, the inside of the sputtering apparatus is evacuated to remove moisture, and impurities such as organic gases generated from the substrate. By removing gases in the apparatus and the substrate in advance, oxidation due to incorporation of oxygen and moisture into the light modulation layer 30 can be suppressed. The degree of vacuum (ultimate vacuum) in the sputtering apparatus before starting of sputtering deposition is, for example, $1 \times 10^{-2}$ Pa or less, preferably $5 \times 10^{-3}$ Pa or less, more preferably $1 \times 10^{-3}$ Pa or less, further preferably $5 \times 10^{-4}$ Pa or less, especially preferably $5 \times 10^{-5}$ Pa or less.

For deposition of the inorganic oxide layer 20, a metal target or an oxide target is used. When a metal target is used, sputtering deposition is performed while in addition to an inert gas such as argon, a reactive gas (e.g. oxygen) is introduced. When an oxide target is used, deposition is performed while an inert gas such as argon is introduced. When an oxide target is used, deposition may be performed while a reactive gas is introduced as necessary.

A metal target is used for deposition of the light modulation layer 30 on the inorganic metal oxide layer 20. When an alloy layer is deposited as the light modulation layer, an alloy target may be used, or a plurality of metal targets may be used. In addition, an alloy layer may also be formed using a target (split target) in which a plurality of metal plates are arranged and bonded on a backing plate in such a manner that an erosion portion has a predetermined area ratio. When a plurality of metal targets are used, an alloy layer having a desired composition can be formed by adjusting an electric power applied to each target. The light modulation layer is deposited while an inert gas is introduced.

The inorganic oxide layer 20 is formed on the polymer film substrate 10, and therefore even if a plasma power during deposition of the light modulation layer reaches the polymer film substrate 10, outgas from the substrate is blocked by the inorganic oxide layer, so that oxidation of the light modulation layer is suppressed. Since an oxygen gas during deposition of the inorganic oxide layer and oxygen atoms of the inorganic oxide are present on a surface of the inorganic oxide layer 20, an oxide layer may be slightly formed in the initial stage of deposition of the light modulation layer 30. An oxide layer having a large thickness (e.g., 15 nm or more) is formed in the initial stage of deposition of the light modulation layer when the light modulation layer is deposited directly on the polymer film substrate, whereas the thickness of an oxide layer, which may be formed in the initial stage of deposition of the light modulation layer, is at most several nanometers (e.g., 5 nm or less) when the light modulation layer is deposited on the inorganic oxide layer. Thus, according to the present invention, a light modulation film having a high transmittance in a transparent state and excellent light modulation performance is obtained.

On the light modulation layer, the buffer layer 50 is deposited as necessary, and the catalyst layer 40 is deposited thereon. For deposition of the buffer layer and the catalyst layer, a metal target is used, and deposition is performed while an inert gas is introduced.

When the surface layer 70 is provided on the catalyst layer 40 after formation of the catalyst layer 40 and preceding layers by the sputtering method, the surface layer 70 may be deposited by a sputtering method, or other method. When the surface layer is formed of an organic material such as a polymer, or an organic-inorganic hybrid material, it is preferable that deposition is performed by a wet method such as spin coating, clip coating, gravure coating or die coating. When the surface layer is formed of an inorganic material, a wet method such as the above-mentioned coating method, CBD method, plating method, or the like may be employed, or a sputtering method, a vacuum vapor deposition method, an electron beam vapor deposition method, a CVD method or the like can also be employed.

[Light Modulation Element]

The light modulation film of the present invention can be used for a hydrogen-activation-type light modulation element capable of switching a light-transmissive state and a light-reflective state by hydrogenation and dehydrogenation of the light modulation layer. The method for hydrogenating and dehydrogenating the light modulation layer is not particularly limited. Examples thereof include a method in which the light modulation film is exposed to a hydrogen atmosphere to hydrogenate the light modulation layer, and the light modulation film is exposed to an oxygen atmosphere (air) to dehydrate the light modulation layer (gas chromic method); and a method in which the light modulation layer 30 is hydrogenated and dehydrogenated using a liquid electrolyte (electrolytic solution) or a solid electrolyte (electrochromic method). Among them, the gas chromic method is preferable because it is possible to switch a light modulation layer having a large area in a short time.

The light modulation film of the present invention as it is may be used as a light modulation element, or may be combined with a transparent member such as glass, a translucent member, an opaque member or the like to form a light modulation element. In the light modulation film of the present invention, the light modulation layer can be transformed into a transparent state by hydrogenation to transmit light. Therefore, in a light modulation element combined with a transparent member, switching between a transparent state and a reflective state can be performed by hydrogenation and dehydrogenation of the light modulation layer.

When the light modulation film is combined with other member to form a light modulation element, it is preferable to fix the light modulation film by bonding with an adhesive or an adhesive tape, or pinning for preventing displacement. As fixing means for fixing the light modulation film and other member, an adhesive is preferable because the fixing area can be increased. As the adhesive, a pressure sensitive adhesive is preferably used. By providing a pressure sensitive adhesive on the polymer film substrate 10 of the light modulation film 1 or 2 in advance, glass or the like and the light modulation film can be easily bonded to each other. As the pressure sensitive adhesive, one having excellent transparency, such as an acryl-based pressure sensitive adhesive is preferably used.

The light modulation element including the light modulation film of the present invention can be applied to window panes of buildings and vehicles, shields for the purpose of protecting privacy, various kinds of decorations and the like. Since a flexible substrate is used in the light modulation film of the present invention, the light modulation film is easily processed, and can be applied to a curved surface, resulting in excellent versatility.

A gas chromic-type light modulation element can also be formed by disposing the light modulation film of the present invention in a gas-filling chamber. When gaps between a plurality of transparent members are set as a gas-filling chamber, and the light modulation element is disposed in the gas-filling chamber, it is possible to switch between the transparent state and the reflective state by supplying hydrogen to and discharging hydrogen from the inside of the gas-filling chamber.

Figure 3:
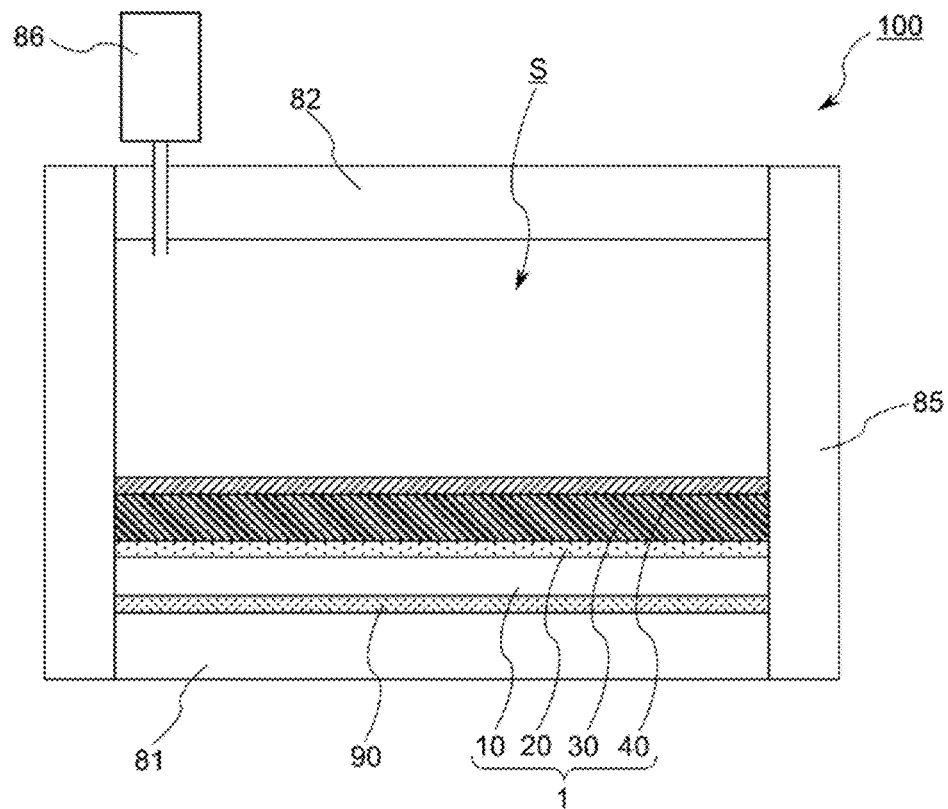
FIG. 3 is a schematic sectional view showing one embodiment of a multi-layered glass that includes a light modulation film.

As one embodiment of the gas chromic-type light modulation element including the light modulation film of the present invention, a light modulation element in which a light modulation film is disposed in a space between glasses in a multi-layered glass will be described. FIG. 3 is a schematic sectional view showing one embodiment of a multi-layered glass that functions as a light modulation element. A multi-layered glass 100 includes two glass plates 81 and 82. An inside surface of one glass plate 81, i.e., a surface facing the glass plate 82 is bonded to the light modulation film 1 with an adhesive layer 90 interposed therebetween.

In other words, on the inner surface of one glass plate 81, the adhesive layer 90, the polymer film substrate 10, the inorganic oxide layer 20, the light modulation layer 30 and the catalyst layer 40 are arranged in this order from the glass plate 81 side. The light modulation film may include a buffer layer between the light modulation layer 30 and the catalyst layer 40, and may have a surface layer on the catalyst layer.

In the multi-layered glass 100, a gap between two glass plates 81 and 82 forms a gas-filling chamber S, and an end portion thereof is sealed with a sealing member 85. An inert gas such as, for example, argon is encapsulated in the gas-filling chamber S in advance. An opening is provided in the glass plate 82, and the gas-filling chamber S is spatially connected to an atmosphere control device 86.

The atmosphere control device 86 is configured such that hydrogen, and oxygen or air can be supplied to and discharged from the gas-filling chamber S. For example, the atmosphere control device 86 can be configured such that electrolysis of water is performed to supply hydrogen and oxygen, and the gas in the gas-filling chamber S is discharged to the outside using a vacuum pump.

When hydrogen is supplied in the form of a gas from the atmosphere control device 86 to the gas-filling chamber S, the light modulation layer 30 is hydrogenated through the catalyst layer 40 to turn into a transparent state. In addition, when an oxygen gas or air is supplied from the atmosphere control device 86 to the gas-filling chamber S, the light modulation layer 30 is dehydrogenated through the catalyst layer 40 and the buffer layer 50 to turn into a reflective state. Thus, by supplying a gas to and discharging a gas from the atmosphere control device 86, the atmosphere in the gas-filling chamber S can be controlled to reversibly switch between the transparent state and the reflective state. In addition, when supply and discharge of a gas is interrupted, the state can be kept unchanged.

Although the gas-filling chamber S and the atmosphere control device 86 are connected to each other through the opening provided in the glass plate 82 in the embodiment shown in FIG. 3, the atmosphere control device may be connected through an opening or the like provided in a sealing member. An atmosphere controller capable of generating a hydrogen gas and an oxygen gas may be disposed in the gas-filling chamber S. In addition, in the embodiment shown in FIG. 3, the light modulation film is bonded onto only one glass plate 81, but the light modulation film may also be bonded onto the glass plate 82.

EXAMPLES

Hereinafter, the present invention will be described more in detail by showing examples, but the present invention is not limited to the following examples.

Example 1

A roll of a 188 μm-thick polyethylene terephthalate (PET) film (manufactured by Mitsubishi Plastics, Inc.) was set in a roll-to-roll sputtering apparatus, and the inside of a sputtering apparatus was evacuated until the ultimate vacuum degree reached $5\times10^{-3}$ Pa. The PET film substrate was conveyed in the sputtering apparatus without introducing a sputtering gas, and as a result, the internal pressure of the apparatus increased to $4\times10^{-2}$ Pa. This is because residual gas contained in the PET film was released into the sputtering apparatus.

Thereafter, a sputtering gas was introduced into the sputtering apparatus, and an inorganic oxide layer formed of silicon oxide, a light modulation layer including an Mg—Y alloy and a catalyst layer including Pd were sequentially deposited while the film substrate was run on a deposition roll.

For deposition of the silicon oxide layer, sputtering deposition (power source: AC/MF) was performed under a vacuum environment at a pressure of 0.2 Pa using a B-doped Si target (manufactured by Mitsubishi Materials Corporation) while argon and oxygen were introduced as a sputtering gas. An Mg—Y split target (manufactured by RARE METALLIC Co., Ltd.) having an Mg metal plate and a Y metal plate at an erosion portion area ratio of 2:5 was used for deposition of the Mg—Y alloy layer. Argon was introduced as a sputtering gas, and sputtering deposition (power source: DC) was performed under a vacuum environment at a pressure of 0.4 Pa. A Pd metal target (manufactured by Tanaka Kikinzoku Kogyo) was used for deposition of the Pd layer. Argon was introduced as a sputtering gas, and sputtering deposition (power source: DC) was performed under a vacuum environment at a pressure of 0.4 Pa.

Figure 4:
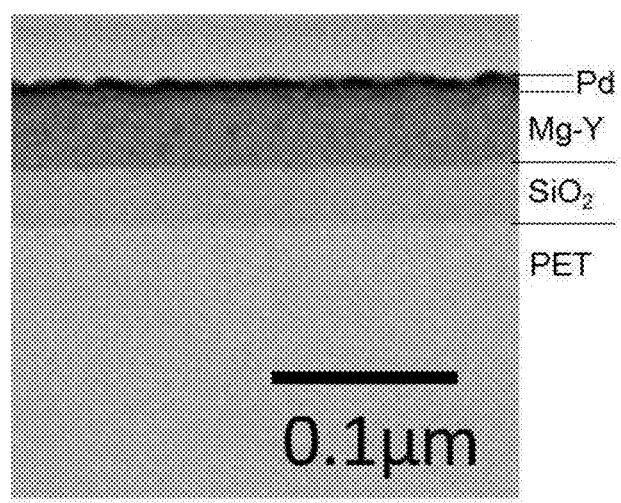
FIG. 4 is TEM observation image of a cross-section of a light modulation film in an example.

In the resulting light modulation film, the thickness of the silicon oxide layer was 30 nm, the thickness of the Mg—Y alloy layer was 40 nm, and the thickness of the Pd layer was 7 nm. FIG. 4 shows an observation image of a cross-section of the light modulation film under a tunnel scanning electron microscope (TEM). The moisture permeability at 40° C. and 90% RH of a stacked film with a silicon oxide layer deposited on a PET film under the same conditions was 0.2 g/m$^2$ day.

Comparative Example 1

Without depositing a silicon oxide layer, an Mg—Y alloy layer was deposited directly on a PET film under the same conditions as in Example 1, and a Pd layer was deposited on the Mg—Y alloy layer.

Comparative Example 2

Figure 5:
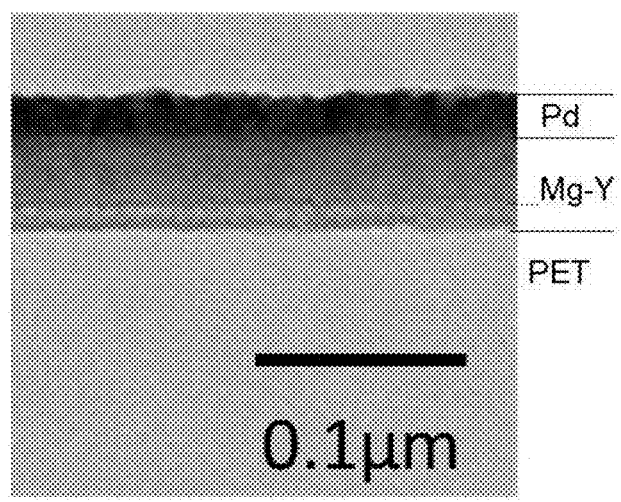
FIG. 5 is TEM observation image of a cross-section of a light modulation film in a comparative example.

An Mg—Y alloy layer was deposited directly on a PET film under the same conditions as in Comparative Example 1, and a Pd layer with a thickness of 18 nm was deposited on the Mg—Y alloy layer. FIG. 5 shows a TEM observation image of a cross-section of the resulting light modulation film. In the TEM images in Comparative Examples 1 and 2, the thickness of the Mg—Y layer tended to be slightly larger as compared to Example 1. This may be because the volume was increased due to formation of the oxidized region layer.

[Evaluation of Light Modulation Performance]

The light modulation films of Examples and the Comparative Example were in a metallic luster reflective state. The light modulation films turned to a transparent state by hydrogenation of the Mg—Y alloy layer when exposed to a hydrogen gas atmosphere at 1 atm with the hydrogen gas diluted to 4% by volume with argon. After the light transmittances of the light modulation films were measured under the hydrogen gas atmosphere, the light modulation films were then returned to an air atmosphere, and dehydrated, and the light transmittances of these light modulation films were measured again. For measurement of the light transmittance, a light emitting diode (EL-1KL3 (peak wavelength: about 940 nm) manufactured by KODENSHI CORP.) was used as a light source, and a photodiode (SP-1ML manufactured by KODENSHI CORP.) was used as a light receiving element. There is almost no difference between transmittances of the light modulation film at a wavelength of 940 nm and at a wavelength of 750 nm which corresponds to a visible light region. The difference between light transmittances in a hydrogenated state (transparent state) and in a dehydrogenated state (reflected state) was defined as light modulation performance. Thickness of each layer in the light modulation film and light modulation performance of each Example and Comparative Example are summarized in Table 1.

[Evaluation of Oxygen Atoms in Light Modulation Layer in the Vicinity of Surface of Inorganic Oxide Layer]

An oxygen concentration distribution in the light modulation layer was determined by performing depth profile measurement using a scanning X-ray photoelectron spectrometer equipped with an Ar ion etching gun ("Quantum 2000" manufactured by ULVAC-PHI, Inc.). In analysis of the depth profile, a position which is situated between the light modulation layer and the silicon oxide layer and at which the Si element concentration is a half value of the maximum value of the Si element concentration in the silicon oxide layer was defined as an interface between the light modulation layer and the silicon oxide layer (end point of the light modulation layer). The thickness (depth) in the depth profile was calculated by converting the etching time into the depth on the basis of the Ar ion etching rate of the silicon oxide layer. From the resulting depth profile, the thickness of a region (oxidized region) having an oxygen concentration of 50 atom % or more in the vicinity of the interface with the silicon oxide layer was determined.

Table 1 shows the thickness and light modulation performance of each layer in the light modulation film of each Example and the Comparative Example.

TABLE 1

| | thickness (nm) | | | | light modulation performance (%) |
|---|---|---|---|---|---|
| | SiO$_2$ | Mg—Y entire | Mg—Y oxidized region | Pd | |
| Example 1 | 430 | 40 | 2 | 7 | 35.8 |
| Comparative Example 1 | — | 40 | 18 | 7 | 30.5 |
| Comparative Example 2 | — | 40 | 18 | 18 | 17.1 |

The light modulation film of Example 1 with an inorganic oxide layer provided on a film substrate exhibited higher light modulation performance as compared to the light modulation films of Comparative Examples 1 and 2 with a light modulation layer formed directly on a film substrate. In the light modulation film of each of Comparative Examples, TEM observation of a cross-section showed that on the film substrate interface side of the Mg—Y light modulation layer, regions different in contrast (on the PET film interface side of Mg—Y in FIG. 5) existed due to oxidation of the light modulation metallic material, and in each of Comparative Examples 1 and 2, the oxidized region had a thickness of 18 nm as determined from the depth profile in XPS. It is considered that this oxidized region was generated due to oxidation of the metal by a residual gas released from the PET film. On the other hand, in the TEM observation image of the light modulation film of the Example (FIG. 4), an oxidized region as in Comparative Examples was not observed, and the thickness of the oxidized region was about 2 nm in the depth profile in XPS.

In Comparative Example 2 in which the thickness of the catalyst layer was increased, the thickness of the oxidized region in the light modulation layer was equal to that in Comparative Example 1, but light modulation performance was further deteriorated as compared with Comparative Example 1. This may be mainly because the catalyst layer had a large thickness, and therefore the light transmittance in the transparent state decreased. It is apparent that the catalyst layer also acts as an oxygen blocking layer, and therefore has a function of suppressing oxidation of the light modulation layer, but even when the thickness of the catalyst layer is increased as in Comparative Example 2, the thickness of the oxidized region is not reduced. These results show that the oxidized region of the light modulation layer is resulted mainly from the polymer film substrate, and by providing an inorganic oxide layer on the polymer film substrate as in the example, oxidation of the light modulation layer is suppressed, so that high light modulation performance can be exhibited.

DESCRIPTION OF REFERENCE CHARACTERS 1, 2 light modulation film
10, 12 polymer film substrate
20 inorganic oxide layer
30 light modulation layer
40 catalyst layer
50 buffer layer
70 surface layer
100 multi-layered glass
81, 82 glass plate
85 sealing member
86 atmosphere control device
90 adhesive layer

The invention claimed is:

1. A light modulation film comprising: a polymer film substrate; an inorganic oxide layer, a light modulation layer whose state is reversibly changed between a transparent state by hydrogenation and a reflective state by dehydrogenation, and a catalyst layer that promotes hydrogenation and dehydrogenation in the light modulation layer, in this order on the polymer film substrate, wherein
the light modulation layer is a thin-film that includes a metal or a hydride of the metal, the metal is selected from the group consisting of a rare earth metal, an alloy of a rare earth metal and magnesium, an alloy of an alkaline earth metal and magnesium, and an alloy of a transition metal and magnesium,
the inorganic oxide layer is an oxide thin-film containing an oxide of an element different from a metal element that constitutes the light modulation layer, and the element of the oxide is at least one selected from the group consisting of Si, Ge, Pb, Al, Ga, Tl, As, Bi, Se, Te, Mg, Ca, Sr, Ba, Sc, Y, Ti, Zr, Hf, V, Nb, Ta, Cr, Mo, W, Mn, Tc, Re, Fe, Ru, Os, Co, Rh, Ir, Ni, Pd, Pt, Cu, Ag, Au, and Cd.

2. The light modulation film according to claim 1, wherein the inorganic oxide layer has a thickness of 1 to 200 nm.

3. The light modulation film according to claim 1, wherein the light modulation layer has a thickness of 10 to 500 nm.

4. The light modulation film according to claim 1, wherein a thickness of the inorganic oxide layer is smaller than a thickness of the light modulation layer.

5. A method for manufacturing the light modulation film provided in claim 1, wherein
the inorganic oxide layer, the light modulation layer and the catalyst layer are deposited on the film substrate by a roll-to-roll sputtering.

6. The light modulation film according to claim 1, wherein the element of the oxide in the inorganic oxide layer is at least one selected from the group consisting of Si, Ti, and Nb.

7. The light modulation film according to claim 1, wherein the inorganic oxide layer is an insulating layer.

8. A light modulation element including a light modulation film, wherein
the light modulation film comprises: a polymer film substrate; an inorganic oxide layer, a light modulation layer whose state is reversibly changed between a transparent state by hydrogenation and a reflective state by dehydrogenation, and a catalyst layer that promotes hydrogenation and dehydrogenation in the light modulation layer, in this order on the polymer film substrate, wherein
the light modulation layer is a thin-film that includes a metal or a hydride of the metal, the metal is selected from the group consisting of a rare earth metal, an alloy of a rare earth metal and magnesium, an alloy of an alkaline earth metal and magnesium, and an alloy of a transition metal and magnesium,
the inorganic oxide layer is an oxide thin-film containing an oxide of an element different from a metal element that constitutes the light modulation layer, and the element of the oxide is at least one selected from the group consisting of Si, Ge, Pb, Al, Ga, Tl, As, Bi, Se, Te, Mg, Ca, Sr, Ba, Sc, Y, Ti, Zr, Hf, V, Nb, Ta, Cr, Mo, W, Mn, Tc, Re, Fe, Ru, Os, Co, Rh, Ir, Ni, Pd, Pt, Cu, Ag, Au, and Cd.

9. The light modulation element according to claim 8, further comprising a plurality of transparent members,
the transparent members are arranged to have a gap that constitutes a gas-filling chamber, and
the light modulation film is disposed in the gas-filling chamber.

10. The light modulation element according to claim 9, further comprising an atmosphere control device configured such that hydrogen can be supplied to and discharged from the gas-filling chamber.

11. A light modulation element comprising: a light modulation film; a plurality of transparent members; and an atmosphere control device,
wherein
the transparent members are arranged to have a gap that constitutes a gas-filling chamber,
the light modulation film is disposed in the gas-filling chamber, and
the atmosphere control device is configured such that hydrogen can be supplied to and discharged from the gas-filling chamber,
wherein
the light modulation film comprises: a polymer film substrate; an inorganic oxide layer, a light modulation layer whose state is reversibly changed between a transparent state by hydrogenation and a reflective state by dehydrogenation, and a catalyst layer that promotes hydrogenation and dehydrogenation in the light modulation layer, in this order on the polymer film substrate, and
the inorganic oxide layer contains an oxide of an element different from a metal element that constitutes the light modulation layer.

* * * * *